(12) United States Patent
Won et al.

(10) Patent No.: US 8,883,269 B2
(45) Date of Patent: Nov. 11, 2014

(54) THIN FILM DEPOSITION USING MICROWAVE PLASMA

(75) Inventors: Tae Kyung Won, San Jose, CA (US); Helinda Nominanda, Santa Clara, CA (US); Seon-Mee Cho, Santa Clara, CA (US); Soo Young Choi, Fremont, CA (US); Beom Soo Park, San Jose, CA (US); John M. White, Hayward, CA (US); Suhail Anwar, San Jose, CA (US); Jozef Kudela, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 284 days.

(21) Appl. No.: 13/331,021

(22) Filed: Dec. 20, 2011

(65) Prior Publication Data
US 2012/0171391 A1    Jul. 5, 2012

Related U.S. Application Data

(60) Provisional application No. 61/428,837, filed on Dec. 30, 2010.

(51) Int. Cl.
| | |
|---|---|
| H05H 1/30 | (2006.01) |
| C23C 16/34 | (2006.01) |
| C23C 16/455 | (2006.01) |
| C23C 16/511 | (2006.01) |
| C23C 16/54 | (2006.01) |
| H01J 37/32 | (2006.01) |

(52) U.S. Cl.
CPC ......... *C23C 16/345* (2013.01); *C23C 16/45578* (2013.01); *C23C 16/511* (2013.01); *C23C 16/545* (2013.01); *H01J 37/32192* (2013.01); *H01J 37/3222* (2013.01); *H01J 37/3244* (2013.01)
USPC ............................ 427/575; 427/578; 427/579

(58) Field of Classification Search
USPC .......................... 427/569, 574, 575, 578, 579
See application file for complete search history.

(56) References Cited

U.S. PATENT DOCUMENTS

| | | | |
|---|---|---|---|
| 6,955,177 B1 | 10/2005 | Chiu et al. | |
| 7,465,406 B2 | 12/2008 | Blalock et al. | |
| 7,655,111 B2* | 2/2010 | Horiguchi | ................ 156/345.41 |
| 2002/0040847 A1* | 4/2002 | Ohmi et al. | .............. 204/192.22 |

(Continued)

OTHER PUBLICATIONS

Nguyen, S.V., et al., "High-density plasma chemical vapor deposition of silicon-based dielectric films for integrated circuits." IBM J. Res. Develop., vol. 43, No. 1/2 Jan./Mar. 1999, pp. 109-126.*

(Continued)

*Primary Examiner* — Bret Chen
(74) *Attorney, Agent, or Firm* — Patterson & Sheridan, LLP (57) ABSTRACT

A method of processing a substrate in a processing chamber is provided. The method generally includes applying a microwave power to an antenna coupled to a microwave source disposed within the processing chamber, wherein the microwave source is disposed relatively above a gas feeding source configured to provide a gas distribution coverage covering substantially an entire surface of the substrate, and exposing the substrate to a microwave plasma generated from a processing gas provided by the gas feeding source to deposit a silicon-containing layer on the substrate at a temperature lower than about 200 degrees Celsius, the microwave plasma using a microwave power having a power density of about 500 milliWatts/cm$^2$ to about 5,000 milliWatts/cm$^2$ at a frequency of about 1 GHz to about 10 GHz.

5 Claims, 5 Drawing Sheets

(56) References Cited

U.S. PATENT DOCUMENTS

| | | | |
|---|---|---|---|
| 2002/0052124 A1* | 5/2002 | Raaijmakers et al. | 438/778 |
| 2003/0194496 A1* | 10/2003 | Xu et al. | 427/255.28 |
| 2004/0031566 A1* | 2/2004 | Takahashi et al. | 156/345.35 |
| 2004/0209005 A1* | 10/2004 | Goto et al. | 427/579 |
| 2005/0059264 A1* | 3/2005 | Cheung et al. | 438/789 |
| 2006/0018639 A1* | 1/2006 | Ramamurthy et al. | 392/416 |
| 2006/0099799 A1* | 5/2006 | Kohno et al. | 438/624 |
| 2010/0034984 A1 | 2/2010 | Asmussen et al. | |
| 2011/0097517 A1* | 4/2011 | Stowell et al. | 427/575 |
| 2011/0217849 A1* | 9/2011 | Lerch et al. | 438/758 |
| 2012/0115334 A1* | 5/2012 | Takaba | 438/784 |

OTHER PUBLICATIONS

International Search Report and Written Opinion dated Aug. 14, 2012 for International Application No. PCT/US2011/066124.

* cited by examiner

THIN FILM DEPOSITION USING MICROWAVE PLASMA

CROSS-REFERENCE TO RELATED APPLICATIONS

This application claims benefit of U.S. provisional patent application Ser. No. 61/428,837, filed Dec. 30, 2010, which is herein incorporated by reference.

BACKGROUND OF THE INVENTION

1. Field of the Invention

Embodiments of the present invention generally relate to deposition processes for a silicon-containing dielectric layer using an improved microwave-assisted CVD chamber.

2. Description of the Related Art

In the manufacture of integrated circuits, chemical vapor deposition (CVD) processes are often used for deposition or etching of various material layers. Examples of common CVD technologies include thermal CVD, low pressure CVD (LPCVD), plasma-enhanced CVD (PECVD), microwave plasma-assisted CVD, atmospheric pressure CVD, and the like. Conventional thermal CVD processes supply reactive compounds to the substrate surface where heat-induced chemical reactions take place to produce a desired layer. Plasma enhanced chemical vapor deposition (PECVD) processes employ a power source (e.g., radio frequency (RF) power or microwave power) coupled to a deposition chamber to increase dissociation of the reactive compounds. Thus, PECVD processes is a prolific and cost effective method for fast growth of materials of good quality at lower substrate temperatures (e.g., about 75° C. to 650° C.) than those required for analogous thermal processes. This is advantageous for processes with stringent thermal budget demands.

As demand for larger flat panel displays and solar panels continues to increase, so must the size of the substrate and hence, the size of the processing chamber. For thin film deposition, it is often desirable to have a high deposition rate to form films on large substrates, and flexibility to control film properties. Higher deposition rate may be achieved by increasing plasma density or lowering the chamber pressure. Microwave plasma-assisted CVD (MPCVD) has been developed to achieve higher plasma densities (e.g. $10^{11}$ ions/cm$^3$) and higher deposition rate, as a result of improved power coupling and absorption at 2.45 GHz when compared to typical radio frequency (RF) coupled plasma sources running at 13.56 MHz. One drawback of using RF plasma is that a large portion of the input power is dropped across the plasma sheath (dark space). By using microwave plasma, a narrow plasma sheath is formed and more power can be absorbed by the plasma for creation of radical and ion species. This can increase the plasma density with a narrow energy distribution by reducing collision broadening of the ion energy distribution.

In the past, the main drawback associated with microwave source technology in the vacuum coating industry was the difficulty in maintaining homogeneity during scale up from small wafer processing to very large area substrate processing. Recent advances in microwave reactor design have placed these challenges within reach. Arrays of plasma linear sources have been developed to deposit substantially uniform films of ultra large area (greater than 1 m$^2$) at a high deposition rate to form dense and thick films. However, as the size of the substrate continues to increase, there is a continuing need in the art for improving plasma homogeneity and density to deposit uniform films on a substrate of a large area at a higher deposition rate while making large-scale manufacturing possible at reasonable cost.

SUMMARY OF THE INVENTION

Embodiments of the present invention generally provide deposition processes for a silicon-containing dielectric layer using an improved microwave-assisted CVD chamber. In one embodiment, a method of depositing a silicon-containing layer over a substrate is provided. The method generally includes loading a substrate into a processing chamber having a microwave source and a gas feeding source, flowing a processing gas into the gas feeding source, generating a plasma from the processing gas by applying a microwave power to an antenna coupled to the microwave source, and depositing a silicon-containing layer on the substrate in the presence of the plasma using a microwave power having a power density of about 500 milliWatts/cm$^2$ to about 5,000 milliWatts/cm$^2$ at a frequency of about 1 GHz to about 10 GHz, wherein the substrate is maintained at a temperature lower than about 200 degrees Celsius during the deposition.

In another embodiment, a microwave plasma assisted CVD process for depositing a silicon-containing layer over a substrate is provided. The process generally includes loading a substrate into a processing chamber comprising a microwave source and a gas feeding source that are positioned in a parallel relationship to a substrate susceptor, the microwave source having one or more linear microwave generators arranged in a parallel coplanar relationship from each other, and the gas feeding source having an array of gas feeding lines arranged in a parallel coplanar relationship from each other, flowing precursor gases into the gas feeding source, generating a plasma from the precursor gases by modulating a microwave power into the microwave source, distributing the precursor gases uniformly from the gas feeding source toward substantially an entire surface of the substrate placed on the substrate susceptor, and depositing a silicon-containing layer on the substrate in the presence of the plasma using a microwave power having a power density of about 500 milliWatts/cm$^2$ to about 5,000 milliWatts/cm$^2$ at a frequency of about 1 GHz to about 10 GHz, wherein the substrate is maintained at a temperature lower than about 200 degrees Celsius during the deposition.

In yet another embodiment, a method of processing a substrate in a processing chamber is provided. The method generally includes applying a microwave power to an antenna coupled to a microwave source disposed within the processing chamber, wherein the microwave source is disposed relatively above a gas feeding source configured to provide a gas distribution coverage covering substantially an entire surface of the substrate, and exposing the substrate to a microwave plasma generated from a processing gas provided by the gas feeding source to deposit a silicon-containing layer on the substrate at a temperature lower than about 200 degrees Celsius, the microwave plasma using a microwave power having a power density of about 500 milliWatts/cm$^2$ to about 5,000 milliWatts/cm$^2$ at a frequency of about 1 GHz to about 10 GHz.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide deposition processes for a silicon-containing dielectric layer (e.g., SiN) using an improved microwave-assisted CVD chamber. The improved microwave-assisted CVD chamber includes a gas feeding source and a coaxial microwave source that are positioned in a parallel relationship with a substrate susceptor upon which a substrate is placed. The gas feeding source may be located between the coaxial microwave source and the substrate susceptor. The gas feeding source may include an array of gas feeding lines which are arranged parallel and longitudinally spaced from each other. The coaxial microwave source may include a single or plural linear microwave generator which may be arranged in a parallel relationship to the longitudinal direction of the gas feeding lines. By using the inventive apparatus with microwave plasma source, good quality of CVD film can be obtained without the need of substrate susceptors using expensive heating elements, which would otherwise be required in a typical plasma-enhanced chemical vapor deposition processes, thereby lowering the manufacturing cost and maintenance work associated with the substrate susceptor. In addition, more power can be absorbed by the plasma for creation of radical and ion species, which in turn increases the plasma density and deposition rate. Therefore, a lower substrate temperature (e.g. lower than 200 degrees Celsius) may be achieved as a result of increased plasma density.

Exemplary Deposition Chamber

Figures 1A, 1B, 1C:
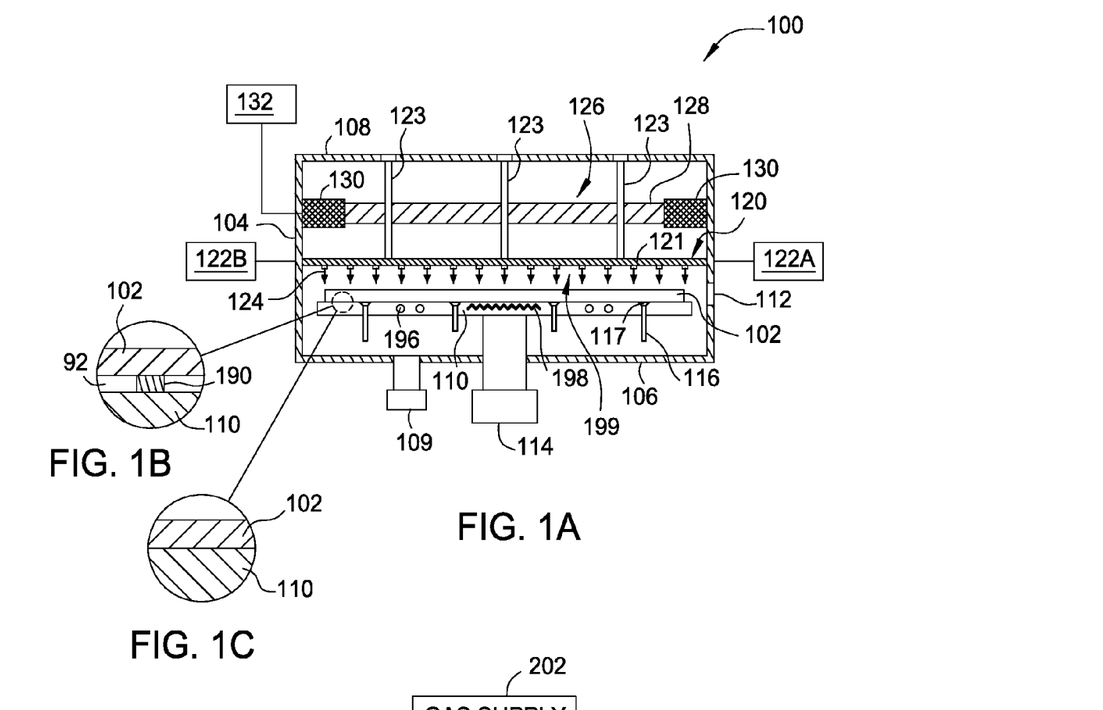
FIG. 1A is a cross-sectional view of a schematic coaxial microwave plasma-assisted CVD chamber according to one embodiment of the invention.
FIGS. 1B and 1C are enlarged views of alternative embodiments showing the substrate is spaced from the upper surface of the substrate susceptor or in contact with the upper surface of the substrate susceptor.

FIG. 1A is a cross-sectional view of a schematic coaxial microwave plasma-assisted CVD chamber 100 according to one embodiment of the invention. The process chamber 100 is configured to allow one or more films to be deposited onto a substrate 102 without removing the substrate 102 from the process chamber 100. While the description below will be made in reference to a microwave plasma-assisted CVD chamber, particularly to a horizontal-type chamber where the microwave and gas feeding sources are disposed above a horizontally positioned substrate susceptor for a horizontal deposition process, it is to be understood that the present invention may be applied to those vertical-type deposition chambers with the microwave line sources vertically attached to chamber walls of the process chamber, and a vertically positioned substrate susceptor for supporting a substrate in vertical configuration. Embodiments of a vertical-type deposition chamber that may be adapted to benefit from the invention are described in, for example, U.S. patent Ser. No. 12/833,571, entitled "DYNAMIC VERTICAL MICROWAVE DEPOSITION OF DIELECTRIC LAYERS" which is incorporated herein by reference. The present invention is equally applicable to other processing chambers, including those made by other manufacturers, and other plasma assisted processes as well, such as etching, ion implanting, surface treatment, and the like. In addition, it should be noted that the Figures and the corresponding description are merely exemplary, and any individual hardware feature described in a single embodiment can be combined with any of other embodiments described in the specification.

The substrate 102 may be, among others, a thin sheet of metal, plastic, organic material, silicon, glass, quartz, or polymer materials. In one embodiment, the substrate 102 is a glass substrate upon which a silicon-containing dielectric will be deposited. In other embodiments, the substrate 102 may be doped or otherwise modified glass substrate. The substrate 102 may have a surface area greater than about 1 square meter, such as greater than about 2 square meters. As will be discussed later, the present invention is particularly useful for deposition of silicon-containing layer (e.g., SiN) on large-sized substrates having a plan surface area of about 15,600 $cm^2$, or greater, for example about a 90,000 $cm^2$ plan surface area. The process chamber 100 may be configured to deposit a variety of materials on the substrates 102, including but not limited to dielectric materials (e.g., $SiO_2$, $SiO_xN_y$, derivatives thereof or combinations thereof), semiconductive materials (e.g., Si and dopants thereof), barrier materials (e.g., $SiN_x$, $SiO_xN_y$, or derivatives thereof), or amorphous silicon or microcrystalline silicon thin film transistor (TFT) passivated by silicon-containing dielectric layer. Specific examples of dielectric materials and semiconductive materials that are formed or deposited by the plasma process chamber 100 onto the large area substrates may include, but is not limited to epitaxial silicon, polycrystalline silicon, amorphous silicon, microcrystalline silicon, silicon germanium, germanium, silicon dioxide, silicon oxynitride, silicon nitride, dopants thereof (e.g., B, P, or As), derivatives thereof or combinations thereof. The process chamber 100 is also configured to receive gases such as argon, hydrogen, nitrogen, helium, or combinations thereof, for use as a purge gas or a carrier gas (e.g., Ar, $H_2$, $N_2$, He, derivatives thereof, or combinations thereof).

The process chamber 100 generally includes chamber walls 104, a chamber bottom 106 and a chamber lid 108 which define a process volume 199 therein. The process volume is coupled to a vacuum system 109 and has a substrate susceptor 110 disposed therein. The process volume is accessed through a slit valve opening 112 such that the substrate 102 may be transferred in and out of the process chamber 100. The chamber walls 104, chamber bottom 106, and the chamber lid 108 may be fabricated from a unitary block of aluminum or other material compatible for plasma processing. The chamber lid 108 is supported by the chamber walls 104 and can be removed to service the process chamber 100. The substrate susceptor 110 may be coupled to an actuator 114 to raise and lower the substrate susceptor 110. In certain embodiments of the present invention as shown in FIG. 1B, spacers 190 may be arranged on the surface of the substrate susceptor 110 in a way such that the substrate remains substantially flat during deposition without touching the surface of the substrate susceptor 110. For example, three spacers 190 (only one is shown) may be equally spaced on the substrate susceptor 110 to space the substrate 102 from the upper surface of the substrate susceptor 110 as to form a gap 92 therebetween. The spacers 190 may be fabricated from any metal, ceramics, high temp material and have a thickness between about 1 mm to about 100 mm to space the substrate 102 by the same distance above the substrate susceptor 110. Alternatively, the substrate 102 may be in contact with the surface of the substrate susceptor 110, as shown in FIG. 1C.

The substrate susceptor 110 may optionally include heating and/or cooling elements to maintain the substrate susceptor 110 at a desired temperature. For example, the substrate susceptor 110 may include a resistive heater 198 and/or cooling fluid conduits 196 which are utilize to control the temperature of the substrate 102 disposed on the substrate susceptor 110 during deposition.

Lift pins 116 are moveably disposed through the substrate susceptor 110 to controllably support the substrate 102 prior to placement onto the substrate susceptor 110 and after removal from the substrate susceptor 110. The lift pins 116 are typically comprised of ceramic or anodized aluminum. Generally, the lift pins 116 have first ends 117 that are substantially flush with or slightly recessed from a top surface of the substrate susceptor 110 when the lift pins 116 are in a normal position (i.e., retracted relative to the substrate susceptor 110). The first ends 117 are generally flared or otherwise enlarged to prevent the lift pins 116 from falling through the holes. The lift pins 116 come in contact with the chamber bottom 106 and are displaced from the top surface of the substrate susceptor 110, thereby placing the substrate 102 in a spaced-apart relation to the substrate susceptor 110. In one embodiment, lift pins 116 of varying lengths are utilized so that they come into contact with the bottom 106 and are actuated at different times. Embodiments of a PECVD system having lift pins configured to lift a substrate in an edge to center manner from a substrate susceptor that may be adapted to benefit from the invention are described in U.S. Pat. No. 6,676,761, which is hereby incorporated by reference.

The major components of the process chamber 100 in accordance with the present invention may include, among others, a gas feeding source 120 and a microwave source 126. As will be discussed below in more detail, the microwave source 126 may include one or more coaxial microwave generators 128 that are configured to be parallel to the longitudinal direction of the gas feeding source 120. The gas feeding source 120 may be located between the microwave source 126 and the substrate 102 as shown in FIG. 1A. Optionally, a second gas feeding source (not shown) may be located above the microwave source 126 and near the top (e.g., the chamber lid 108) of the process chamber 100 to improve the deposition rate. FIGS. 2B-2D illustrate various configurations having the gas feeding source 220 located relatively above the microwave source 226 (e.g., located within or immediately adjacent to the chamber lid 108, FIG. 2B) or located in parallel, spaced relationship in a common plane to the microwave source 226 (FIG. 2C). In either case, the precursor gases (e.g., $N_2$ or $SiH_4$) and the carrier gas (Ar) may be provided to the gas feeding source 220. In an alternative embodiment where the gas feeding source 220 is located in space parallel relationship to the microwave source 126, the carrier gas (Ar) may be provided to the a second gas feeding source 221 located in the chamber lid 108 with the precursor gases (e.g., $N_2$ or $SiH_4$) being separately provided to the gas feeding source 220, as shown in FIG. 2D.

Figure 2A:
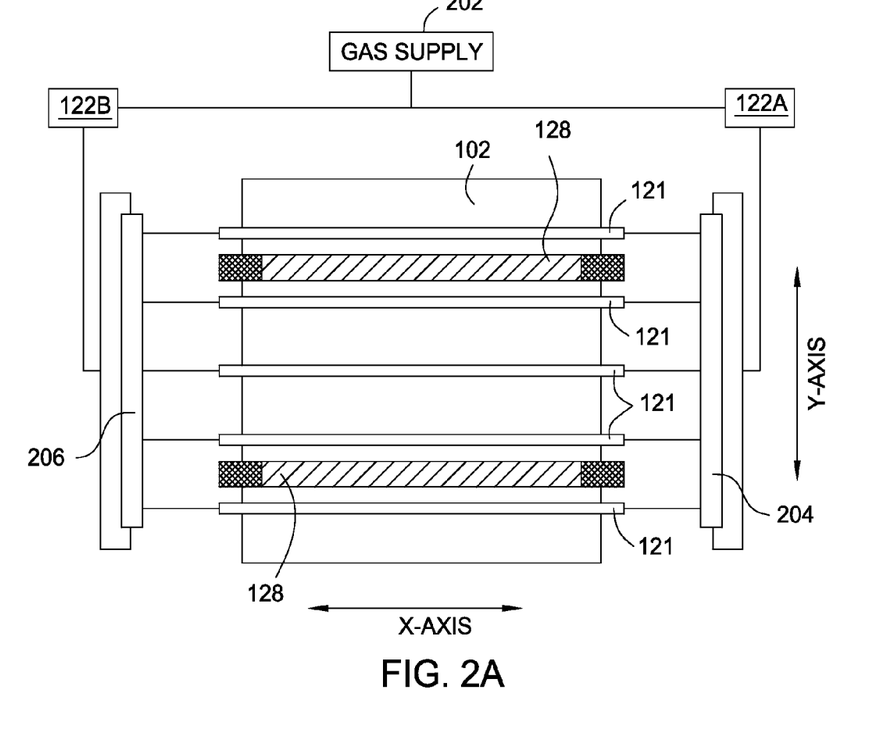
FIG. 2A is a top view of a schematic coaxial microwave plasma-assisted CVD chamber illustrating an exemplary arrangement of a gas feeding source and a coaxial microwave source according to one embodiment of the invention.
Figure 2B:
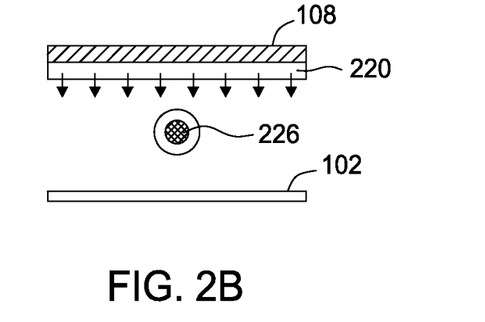
FIGS. 2B-2D are possible configurations of a gas feeding source and a microwave source according to various embodiments of the invention.
Figure 2C:
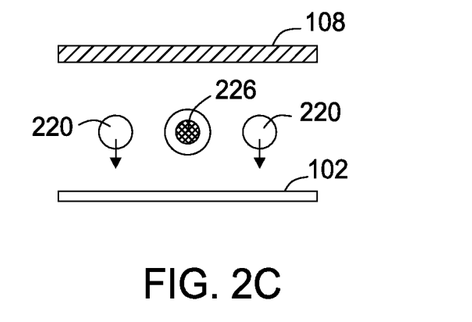
Figure 2D:
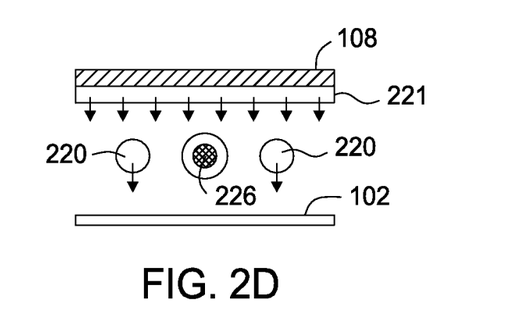

Referring now to FIG. 2A, which illustrates a top view of the microwave source 126 and the gas feeding source 120 shown in FIG. 1A. The gas feeding source 120 may include an array of gas feeding lines 121 that are configured to controllably receive one or more precursor gases and carrier gas from a gas source 122A and/or gas source 122B. The gas feeding lines 121 can be a planar arrangement and may be movably supported by, for example, 3 supporting elements 123. The supporting elements 123 may be made from any suitable materials such as an electrically insulating material. In one example, each supporting elements 123 may have at least 3 fastening mechanisms (not shown) such as nut and bolt assembly, or any other suitable means, disposed along the length of the supporting element 123 and configured to hold a portion of the gas feeding lines 121. The configuration of the supporting elements 123 may vary depending upon application or the number of the gas feeding lines 121 used. Any other supporting mechanism is conceivable as long as the configuration does not significantly affect the film uniformity and/or microwave power from the linear microwave generators 128. In certain embodiments, the gas feeding lines 121 may be supported through chamber walls 104 without the use of supporting elements 123.

While not discussed in detail here, it is contemplated that the supporting elements 123 are vertically (or horizontally) adjustable so that a narrower or wider space between the coaxial microwave source 126 and the gas feeding source 120 can be obtained. It is also contemplated that the position of the gas feeding source 120 may be adjusted in the vertical axis to be closer or away from the substrate depending upon processing parameters to obtain desired film properties.

The array of gas feeding lines 121 are arranged parallel and longitudinally spaced from each other (FIG. 2A), and each of the plurality of gas feeding lines 121 has perforated holes (not shown) facing the substrate 102. The holes are arranged at substantially regular intervals along the length of the gas feeding lines 121 to provide a substantially uniform gas flow covering substantially the upper surface of the substrate 102. The gas feeding source 120 may include about 3 to about 20 gas feeding lines 121, depending upon the size of the substrate. It has been observed that a single gas feeding line 121 may cover about 100 mm area in the normal direction with about 10% non-uniformity. For a substrate having a size of 730 mm×920 mm, the gas feeding source 120 may have 10 gas feeding lines 121. The distance between the gas feeding lines 121 (i.e., a gas feeding line to an immediate adjacent gas feeding line) may vary upon application between about 50 mm and about 200 mm, such as between about 100 mm and about 130 mm, for example about 110 mm. The length of each gas feeding lines 121 may vary depending upon the size of the substrate 102. The length of each of the gas feeding lines 121 may be up to about 2.5 m, i.e., longer than the diameter of the substrate 102 to obtain full coverage of the substrate being processed.

As mentioned previously, the array of gas feeding lines 121 as shown in FIG. 2A may receive one or more precursor gases and carrier gas from a gas source 122A and/or gas source 122B. The precursor gases may vary depending upon the application. In cases where a silicon-containing dielectric layer is desired, the precursor gas such as $SiH_4$ and $NH_3$ and carrier gas, for example, Ar, may be provided together or separately from a gas supply 202 to the gas sources 122A, 122B, respectively, before entering the gas feeding lines 121. A gas pipe valve 204, 206 may be placed between the gas sources 122A, 122B and an end of the gas feeding lines 121 to selectively control feeding of the gases from either side or both sides of the gas feeding lines 121. As the film thickness is strongly independent of the gas feeding position, that is, the gas feeding sides always induces higher deposition rate due to higher gas flows at the side, having gases fed from both sides of the gas feeding lines 121 is believed to enhance the uniformity of the film thickness.

Referring back to FIG. 1A, the coaxial microwave source 126 may be located between the gas feeding source 120 and the top (e.g., the chamber lid 108) of the process chamber 100. The coaxial microwave source 126 generally includes a plurality of linear microwave generators 128 and an antenna 130 connected to linear microwave generators 128. The coaxial microwave source 126 may be coupled to ground. In one embodiment, the coaxial microwave source 126 can be a planar arrangement in which the linear microwave generators 128 are arranged parallel and longitudinally spaced from each other (see FIG. 2A; it should be noted that the supporting elements 123 have been omitted from this figure for clarity). While only two linear microwave generators 128 is shown, it is contemplated that the number of the linear microwave generators 128 may be increased or decreased depending upon the size of the substrate. For a substrate having a size of 730 mm×920 mm, the microwave source 126 may have 4 microwave generators 128. In various embodiments, the distance in the Y-axis between the adjacent two linear microwave generators 128 may be about 100 mm to about 500 mm, for example between about 180 mm and about 350 mm, such as 230 mm. A wider spacing may cause a dip profile and non-uniform film properties on substrate surface areas between the microwave generators. Each of the two linear microwave generators 128 may be disposed respectively above and in between two adjacent gas feeding lines 121. It has been observed that a single microwave generator 128 may cover about 260 mm area in the normal direction with about 10% non-uniformity.

The length of each linear microwave generator 128 may be equal or longer than the gas feeding lines 121. For example, the length of each linear microwave generator 128 may be up to about 3 m. In some embodiments of the invention, the coaxial microwave source 126 may be moved along a horizontal direction perpendicular to the X-axis of the substrate 102 (FIG. 2A). This can be done in order to process a large substrate. For example, if the substrate has a dimension of 16 feet long and 3-4 feet wide, the coaxial microwave source 126 may need to be moved along the length of the substrate. However, if the substrate has a dimension of 16 feet long and 16 feet wide, the coaxial microwave source 126 may need to be moved along both the length and the width of the substrate.

Figure 3:
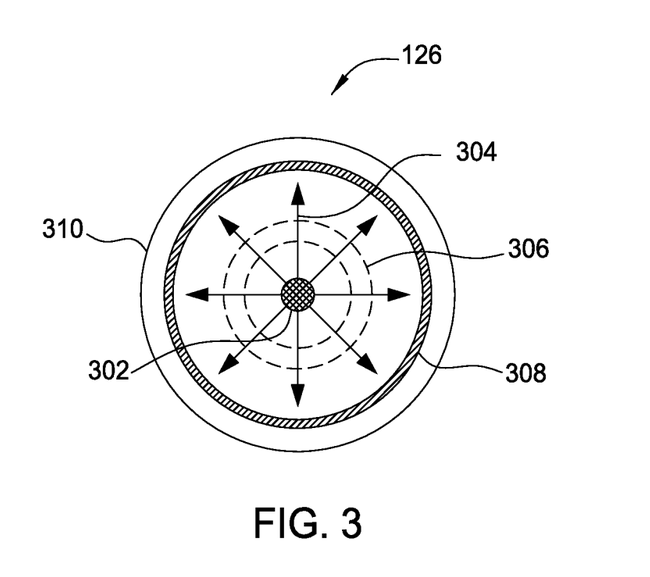
FIG. 3 is a schematic cross-sectional view of the coaxial microwave source according to one embodiment of the invention.

FIG. 3 is a schematic cross-sectional view of the coaxial microwave source according to one embodiment of the invention. The coaxial microwave source 126 generally includes an antenna 130 having a dielectric tube 308 as a pressure isolation barrier. A microwave source 132 is connected to the coaxial microwave source 126 and can input microwaves into the antenna 130 (FIG. 1A). Dual microwave RF input from both side of the chamber is believed to improve coverage along the microwave source since one side microwave RF input may not cover entire area along the source. The microwave source 132 may tune and radiate microwave power into the chamber in a transversal electromagnetic (TEM) wave mode, for example. An optional containment shield (not shown) partially surrounding the antenna 130 with a generally circular cross section may also be used for containing and guiding plasma through an aperture (not shown) formed near the bottom of the containment shield to collide with reactive precursors from the gas feeding lines 121. Air or nitrogen can be filled in the space between the dielectric tube 308 and the containment shield for cooling the antenna 130. Details of the containment shield are further discussed in U.S. patent application Ser. No. 12/238,664, entitled "Microwave Plasma Containment Shield Shaping" by Michael Stowell, the entire contents of which is incorporated herein by reference for all purposes.

A cross sectional view of the coaxial microwave source 126 as shown in FIG. 3 illustrates a conductor (e.g., antenna 302) for radiating microwaves at a frequency of about 2.45 GHz. The radial lines represent an electric field 304 and the circles represent a magnetic field 306. The microwaves propagate through the air and through the dielectric tube 308, which acts as the interface between the waveguide (not shown) having atmospheric pressure and the vacuum chamber. The microwaves passing through the dielectric tube 308 energize the gases within the processing chamber to form plasma 310 outside the surface of the dielectric tube 308. Such a wave sustained near the linear microwave generators 128 is a surface wave. In operation, as illustrated in FIG. 1A, during a process, such as a deposition process, the microwaves travel along the linear microwave generators 128 and go through a high attenuation by converting electromagnetic energy into plasma energy which ignites a plasma within the process volume. Radical species generated by the plasma disassociates the reactive precursors coming from the gas feeding lines 121, which are directed toward the substrate 102 (as indicated by arrows 124) and uniformly distributed radically across the substrate surface, typically in laminar flow, to form a film on the substrate 102 that is held by the substrate susceptor 110. Pressure within the chamber during deposition is controlled by the vacuum system 109.

Exemplary Deposition Process

Figure 4:
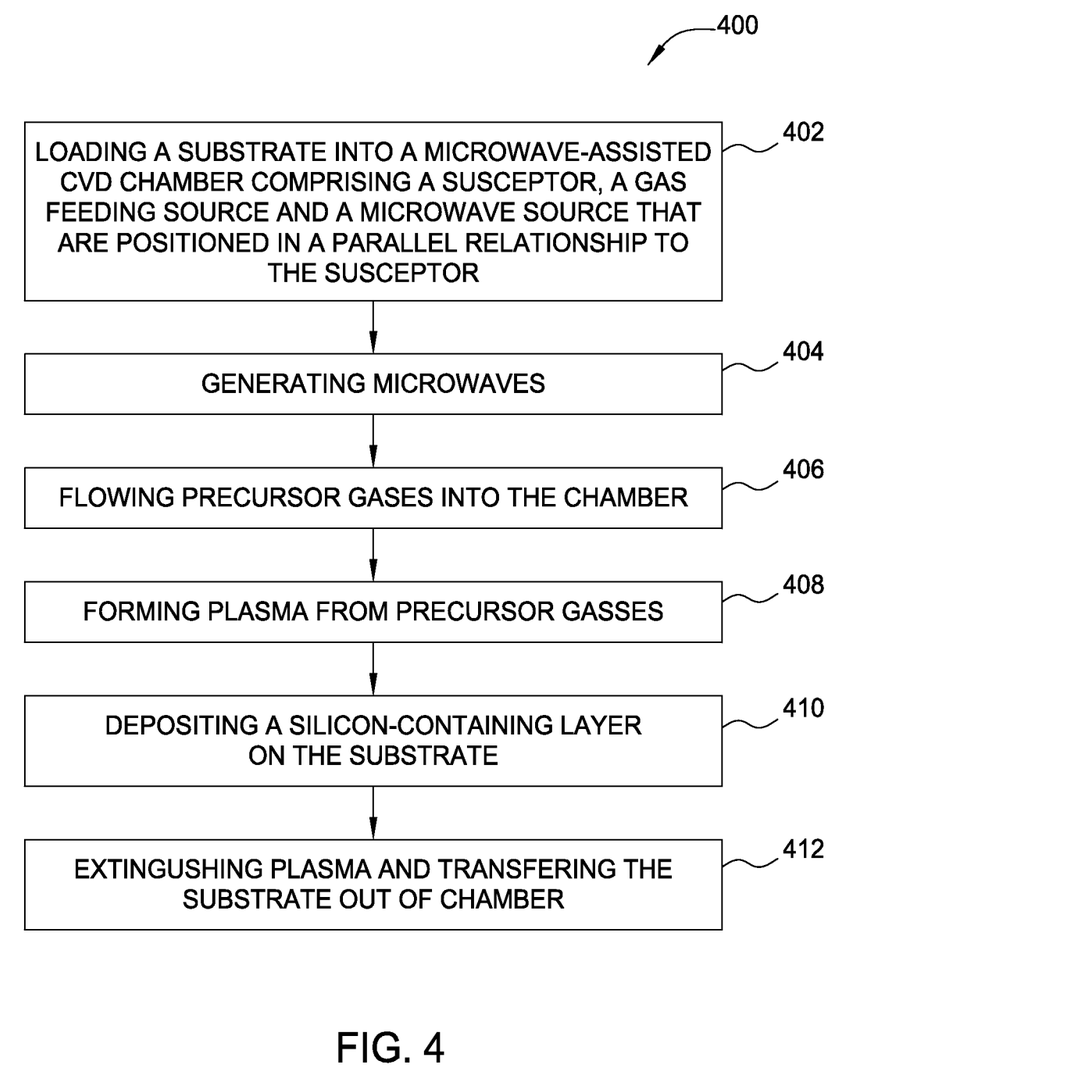
FIG. 4 is a diagram of a process sequence that may be used to form a silicon nitride (SiN) film on a substrate using the inventive microwave plasma-assisted CVD chamber.

FIG. 4 provides a flow diagram of a process sequence 400 that may be used to form a silicon-containing film over a substrate using the inventive microwave plasma-assisted CVD chamber as described above in conjunction with FIGS. 1A and 2A-2D. It should be noted that the configuration, number of processing steps, and order of the processing steps in the process sequence 400 is not intended to be limiting to the scope of the invention described herein, since one or more steps can be added, deleted and/or reordered without deviating from the basic scope of the invention described herein. In addition, while the description below is made in reference to silicon nitride (SiN), it is should be appreciated by those skilled in the art that other silicon-containing layers, such as silicon, silicon dioxide, silicon carbide, silicon oxycarbide, silicon hydride, silicon fluoride, boron or phosphorous or arsenic doped silicon, boron or phosphorous or arsenic doped silicon carbide, boron or phosphorous or arsenic doped silicon oxide etc., is also contemplated. The chemistry and processing parameters as will be described below may be changed/adjusted accordingly depending upon the layer to be deposited. However, the inventive process has been proved to be able to process a single substrate or substrates in a batch processing cycle.

The process begins with step 402 by loading a substrate into a microwave-assisted CVD chamber including a substrate susceptor 110, a gas feeding source 120 and a coaxial microwave source 126 that are positioned in a parallel relationship to the substrate susceptor 110, such as various embodiments described above with respect to FIGS. 1A and 2A-2D. The substrate may be any substrate upon which a silicon-containing dielectric layer can be formed. The substrate may be conductive or non-conductive, and may be rigid or flexible. In some embodiments, the substrate may be a doped or undoped glass substrate. The temperature of the substrate may be controlled to between about 150° C. and about 250° C., such as about 200° C. by heating and/or cooling the substrate susceptor.

At step 404, a microwave is generated in the chamber by an antenna and modulated, for instance, by a microwave source using a pulsing power or a continuous power as discussed above.

At step 406, precursor gases and a carrier gas are provided into the chamber. For deposition of a silicon nitride layer, such precursor gases may include a silicon-containing precursor including, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof, and a nitrogen-containing precursor including, but are not limited to nitrogen ($N_2$), ammonia ($NH_3$), hydrazine ($N_2H_4$), or a mixture thereof. The carrier gas may include argon (Ar), hydrogen ($H_2$), helium (He), derivatives thereof, or combinations thereof. The precursor gases may flow through separate lines to prevent them from reacting prematurely before reaching the substrate. Alternatively, the reactive precursors may be mixed to flow through the same line.

Flow rate of gases to the chamber is dependent upon the size of the substrate being processed. In cases where a substrate measuring 730 mm by 920 mm is processed to deposit a SiN layer with $SiH_4$ and $NH_3$, the gas flow of $SiH_4$ gas may be provided at a flow rate between about 150 sccm/L and about 3,000 sccm/L, such as between about 250 sccm/L and about 1,500 sccm/L, for example between about 300 sccm/L and about 900 sccm/L. The gas flow of $NH_3$ gas may be provided at a flow rate between about 1,200 sccm/L and about 5,000 sccm/L, such as between about 2,000 sccm/L and about 4,000 sccm/L, for example about 3,000 sccm/L. The gas flow of Ar gas may be provided at a flow rate between about 450 sccm/L and about 5,000 sccm/L, such as between about 500 sccm/L and about 3,500 sccm/L, for example about 2,500 sccm/L. Higher Ar flow is believed to improve the uniformity of the microwave plasma, thereby improving the film thickness. The gas flow ratio of $SiH_4$ to $NH_3$ ($SiH_4:NH_3$) may be between about 1:2 and about 1:6, for example, about 1:3. The gas flow ratio of $SiH_4$ to Ar ($SiH_4$:Ar) is between about 1:1 and about 1:20, for example, between about 1:5 and about 1:10. The gas flow ratio of $NH_3$ to Ar ($NH_3$:Ar) may be between about 1:1 and about 1:10, for example, between about 1:2 and about 1:5. The SiN layer may be deposited at a chamber pressure of about 50 mTorr to about 250 mTorr, for example about 100 mTorr.

At step 408, a plasma is formed from the precursor gases by microwave at a frequency ranging from about 1 GHz to about 10 GHz, for example, at 2.45 GHz. A higher frequency of 5.8 GHz may be used when power requirement is not as critical. The benefit of using a higher frequency source is that the higher frequency has smaller size (about half size) of the lower frequency source of 2.45 GHz. A microwave power of about 500 milliWatts/cm$^2$ to about 5,000 milliWatts/cm$^2$, for example about 1,500 milliWatts/cm$^2$ to about 3,000 milliWatts/cm$^2$, is supplied through the antenna into the chamber to generate electromagnetic energy at step 404 to energize the precursor gases at step 408. Higher microwave RF power is believed to enhance plasma uniformity along the microwave source 126. In most embodiments, conditions described above result in a high-density plasma having an ion density that exceeds $10^{12}$ ions/cm$^3$. While in some instances the deposition characteristics may be affected by applying an electrical bias to the substrate to cause the ionic species of the plasma to be attracted to the substrate, in certain embodiments of the present invention the electrical bias may not be required during the deposition to minimize plasma damage on the surface of the substrate. It is contemplated that the environment within the chamber may be regulated by, for example, controlling the pressure within the chamber, controlling the flow rates and/or flow ratio of the precursor gases, or controlling the spacing and/or power used in generating the plasma.

Figure 6:
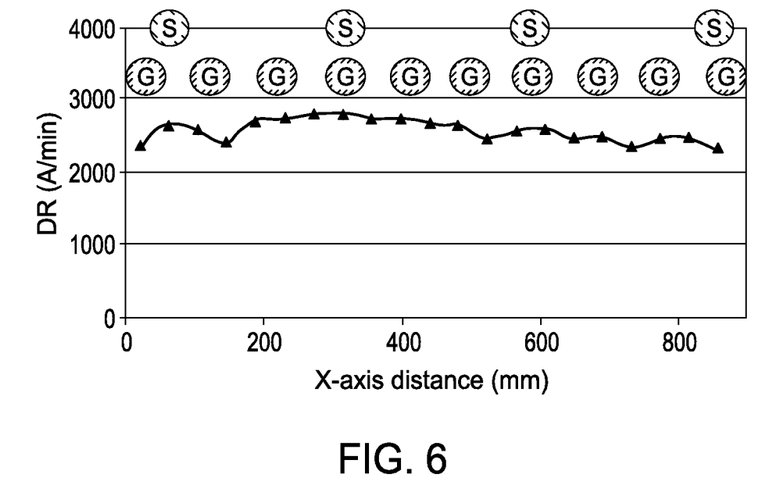
FIGS. 6 and 7 show a graph illustrating the deposition rate as a function of an X-axis distance and Y-axis distance (from the edge of a substrate being processed), respectively.
Figure 7:
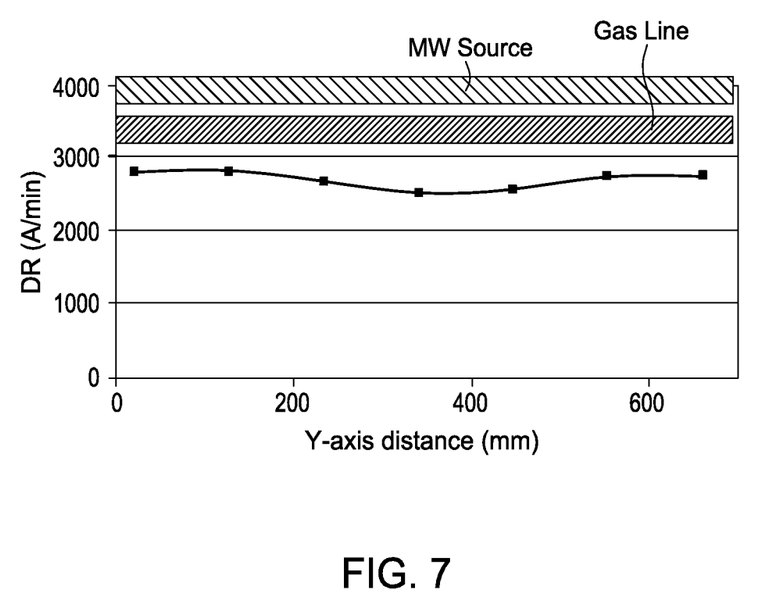

At step 410, a SiN layer is deposited over the substrate. Depending upon the film properties and chamber conditions, the processes as described at steps 404 to 410 may be repeated as many times as desired until a desired film thickness is obtained. In one embodiment where four linear microwave generators and ten gas feeding lines are used, the processing conditions defined above enable a SiN layer to be deposited at a high deposition rate above 2,500 Å/min with a thickness non-uniformity of less than 14% as evidenced by FIGS. 6 and 7, which show a graph illustrating the deposition rate as a function of an X-axis distance and Y-axis distance (from the edge of the substrate), respectively.

At step 412, after deposition is completed, the plasma is extinguished and the substrate is transferred out of the process chamber.

The microwave plasma-assisted CVD chamber according to the present invention offers higher plasma densities and higher deposition rates, as a result of improved arrangement of the gas feeding source and coaxial microwave source when compared to a conventional PECVD process using radio frequency (RF) coupled plasma sources at 13.56 MHz. By using inventive apparatus with microwave plasma source, a narrow plasma sheath is formed and more power can be absorbed by the plasma for creation of radical and ion species, which in turn increases the plasma density with a narrow energy distribution by reducing collision broadening of the ion energy distribution. Therefore, a lower deposition temperature (e.g. lower than 200° C., for instance at 130° C.) can be achieved as a result of increased plasma density at lower ion energy with narrow energy distribution. A comparison between the conventional PECVD process at different deposition temperatures and the inventive microwave CVD process in terms of SiN film properties are shown below in Table I. As can be seen, the low temperature microwave CVD process offers higher deposition rate than the conventional PECVD process performed at about 280° C. or 130° C. with similar or better film properties. The microwave CVD process with lower thermal budget allows for better microcrystalline growth in kinetically limited conditions and is therefore suitable for low temperature deposition processes such as LCD process, OLED display process, or Flexible display process etc.

TABLE I

| | PECVD-SiN (280° C.) | PECVD-SiN (130° C.) | MW-SiN (130° C.) |
|---|---|---|---|
| D/R (Å/min) | 2059 | 1960 | 2500 |
| RI | 1.85 | 1.85 | 1.87 |
| NH % | 23.5 | 24.6 | 27.1 |
| SiH % | 17.0 | 15.5 | 0.4 |
| WER | 3877 | 5146 | 745 |
| STRESS (DYNE/CM$^2$) | T1.5E9 | T2.7E9 | T2.8E9 |

In addition, by using the inventive apparatus with microwave plasma source, the temperature of the substrate can be effectively heated and maintained at a desired temperature during the process. It has been proved that the substrate can be heated up to about 176° C. after 1 minute of exposure to the microwave plasma. Table II below shows process parameters and film properties for a silicon nitride layer that was deposited with the inventive apparatus using microwave plasma source at a chamber pressure of about 130 mTorr and a frequency of about 2.45 GHz. As can be seen, when the susceptor setting temperature is increased from 40° C. to 150° C., the film properties such as RI (reflective index) has not changed significantly, suggesting that the susceptor setting temperature does not affect the film quality. Thus, the use of the inventive microwave-assisted CVD process allows for lower manufacturing cost and lower maintenance work on the susceptor because the expensive heating elements, which would otherwise be required in a typical plasma-enhanced chemical vapor deposition processes for heating and maintaining substrate at a desired temperature, can be eliminated.

TABLE II

| SiH$_4$ (sccm/L) | NH$_3$ (sccm/L) | Ar (sccm/L) | Power (milliW/cm$^2$) | Heater (° C.) | DR (Å/min) | RI | % NH | % SiH | WER (Å/min) |
|---|---|---|---|---|---|---|---|---|---|
| 900 | 3000 | 3000 | 3000 | 40 | 3587 | 1.97 | 18.8 | 8.1 | 68 |
| 900 | 3000 | 3000 | 3000 | 60 | 3461 | 1.97 | 21.2 | 8.5 | 90 |
| 900 | 3000 | 3000 | 3000 | 80 | 3524 | 1.98 | 20.9 | 7.7 | 85 |
| 900 | 3000 | 3000 | 3000 | 100 | 3457 | 1.98 | 20.5 | 6.9 | 60 |
| 900 | 3000 | 3000 | 3000 | 130 | 3563 | 1.98 | 18.5 | 6.5 | 82 |
| 900 | 3000 | 3000 | 3000 | 150 | 3452 | 1.99 | 16.8 | 5.8 | 52 |

Figure 5:
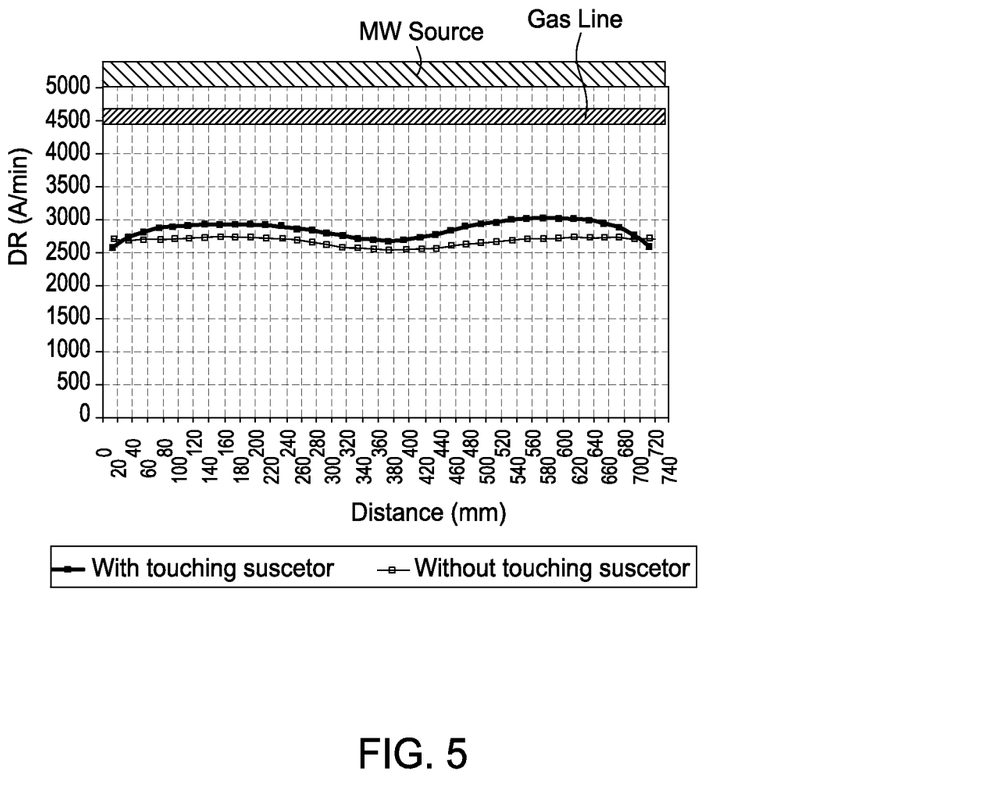
FIG. 5 is a graph illustrating the deposition rate (in Å/min) as a function of the spacing between a coaxial microwave source and a substrate, including a film uniformity comparison for a microwave assisted CVD-deposited SiN film with the substrate in contact with and spaced with the substrate susceptor.

Furthermore, it has been surprisingly discovered by the present inventors that in certain embodiments where a plurality of spacers (high about 1-inch) are arranged on the surface of the substrate susceptor 110 to support/keep the substrate 102 substantially flat without touching the substrate susceptor 110, the thickness non-uniformity of a silicon nitride film is reduced to less than 8.1% when the deposition is performed with the inventive apparatus using microwave plasma source, as described above in conjunction with FIGS. 1 and 2. FIG. 5 shows a graph illustrating the deposition rate as a function of the spacing between a coaxial microwave source and a substrate, including a film uniformity comparison for a silicon nitride film with the substrate in contact with and spaced with the substrate susceptor at substantially similar deposition rate of about 2600 Å/min.

While the foregoing is directed to embodiments of the present invention, other and further embodiments of the invention may be devised without departing from the basic scope thereof, and the scope thereof is determined by the claims that follow.

What is claimed is:

1. A method of depositing a dielectric layer over a substrate, comprising:
supporting a substrate in a processing volume of a processing chamber having a microwave source and a gas feeding source disposed in the processing volume, wherein the gas feeding source comprises an array of gas feeding lines arranged parallel and longitudinally spaced from each other at a distance between about 50 mm and about 200 mm;
providing a processing gas comprising a silicon-containing precursor and argon gas into the gas feeding source at a gas flow ratio of silicon-containing precursor to argon gas (silicon-containing precursor:argon gas) between about 1:5 and about 1:10;
flowing the processing gas from the gas feeding source into the processing volume;
generating a plasma from the processing gas in the processing volume by applying a microwave power to an antenna coupled to the microwave source; and
depositing a dielectric layer on the substrate in the presence of the plasma using a microwave power having a power density of about 500 milliWatts/cm$^2$ to about 5,000 milliWatts/cm$^2$ at a frequency of about 1 GHz to about 10 GHz, wherein the substrate is maintained at a temperature lower than about 200 degrees Celsius during the deposition, and the microwave source comprises one or more linear microwave generators arranged parallel and longitudinally spaced from each other at a distance between about 180 mm and about 350 mm, and wherein the length of the linear microwave generators is about 3 meters.

2. The method of claim 1, wherein the gas feeding lines have a length longer than a diameter of the substrate.

3. The method of claim 1, wherein the one or more linear microwave generators have a length equal or longer than the length of the gas feeding lines.

4. The method of claim 1, wherein the distance between the linear microwave generators and the gas feeding lines is between about 25 mm and about 125 mm.

5. A method of depositing a dielectric layer over a substrate, comprising:
supporting a substrate in a processing volume of a processing chamber having a microwave source and a gas feeding source disposed in the processing volume, wherein the microwave source comprises one or more linear microwave generators arranged parallel and longitudinally spaced from each other at a distance between about 180 mm and about 350 mm, and wherein the gas feeding source comprises an array of gas feeding lines arranged parallel and longitudinally spaced from each other at a distance between about 50 mm and about 200 mm, and wherein the gas feeding lines have a length longer than a diameter of the substrate;
flowing a processing gas from the gas feeding source into the processing volume;

generating a plasma from the processing gas in the processing volume by applying a microwave power to an antenna coupled to the microwave source; and depositing a dielectric layer on the substrate in the presence of the plasma using a microwave power having a power density of about 500 milliWatts/cm$^2$ to about 5,000 milliWatts/cm$^2$ at a frequency of about 1 GHz to about 10 GHz, wherein the substrate is maintained at a temperature lower than about 200 degrees Celsius during the deposition.

* * * * *